(12) United States Patent  
Graf et al.

(10) Patent No.: US 9,496,234 B1
(45) Date of Patent: Nov. 15, 2016

(54) WAFER-LEVEL CHIP-SCALE PACKAGE STRUCTURE UTILIZING CONDUCTIVE POLYMER

(71) Applicant: GLOBALFOUNDRIES INC., Grand Cayman (KY)

(72) Inventors: Richard S. Graf, Gray, ME (US); Kibby B. Horsford, Essex, VT (US); Sudeep Mandal, Bangalore (IN)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/741,802

(22) Filed: Jun. 17, 2015

(51) Int. Cl.
*H01L 23/48* (2006.01)
*H01L 23/00* (2006.01)

(52) U.S. Cl.
CPC .............. *H01L 24/13* (2013.01); *H01L 24/11* (2013.01); *H01L 2224/1147* (2013.01); *H01L 2224/11462* (2013.01); *H01L 2224/13147* (2013.01); *H01L 2224/13155* (2013.01); *H01L 2224/13166* (2013.01); *H01L 2224/13171* (2013.01); *H01L 2224/13172* (2013.01); *H01L 2224/13184* (2013.01)

(58) Field of Classification Search
CPC ......................................................... H01L 24/13
USPC ......................................................... 257/738
See application file for complete search history.

(56) References Cited

U.S. PATENT DOCUMENTS

| 5,611,140 | A | 3/1997 | Kulesza et al. |
| 7,170,187 | B2 | 1/2007 | Bernier et al. |
| 7,442,878 | B2 | 10/2008 | Bernier et al. |
| 8,193,610 | B2 | 6/2012 | Do et al. |
| 2009/0014871 | A1 | 1/2009 | Meyer et al. |

FOREIGN PATENT DOCUMENTS

KR 1020080074591 A 8/2008

*Primary Examiner* — Anthony Ho
(74) *Attorney, Agent, or Firm* — Thompson Hine LLP

(57) ABSTRACT

An integrated conductive polymer-solder ball structure is provided. The integrated conductive polymer-solder ball structure comprises a sputter seed layer applied to a wafer structure, one or more conductive polymer pad structures applied to the sputtered seed layer at locations on the wafer structure where one or more solder ball structures will be formed, an electroplating layer applied to portions of the one or more conductive polymer pad structures where a photoresist layer has been exposed, and a solder ball formed on each of the electroplating layers thereby forming the one or more solder ball structures.

9 Claims, 9 Drawing Sheets

WAFER-LEVEL CHIP-SCALE PACKAGE STRUCTURE UTILIZING CONDUCTIVE POLYMER

BACKGROUND

The present application relates generally to an improved data processing apparatus and method and more specifically to a wafer-level chip-scale package utilizing conductive polymer.

Wafer-level chip-scale package (CSP) (WLCSP) refers to a technology of packaging an integrated circuit at a wafer level, resulting in a device practically the same size as the die. WLCSP provides a solder interconnection directly between a device and an end product's motherboard. WLCSP includes wafer bumping (with or without pad layer redistribution or redistribution layer (RDL)), wafer level final test, device singulation, and packing in tape and reel. Some of the most widely offered WLCSP options include WLCSP bump on pad (BOP) and WLCSP with a redistribution layer (RDL).

The WLCSP bump on pad (BOP) option provides a reliable, cost-effective, true chip-size package on devices not requiring redistribution. The WLCSP BOP option utilizes a repassivation polymer layer with excellent electrical/mechanical properties. Under-Bump-Metallurgy (UBM) is added and solder bumps are then placed directly over die I/O pads. WLCSP-BOP is designed to utilize industry-standard surface mount assembly and reflow techniques.

The WLCSP with a redistribution layer (RDL) option adds a plated copper Redistribution Layer (RDL) to route I/O pads to Joint Electron Device Engineering Council (JEDEC)/Electronic Industries Association of Japan (EIAJ) (JEDEC/EIAJ) standard pitches, avoiding the need to redesign legacy parts for CSP applications. A nickel based or thick copper UBM, along with polyimide or polybenzoxazole (PBO) dielectrics, provide improved board level reliability performance. WLCSP with RDL utilizes industry-standard surface mount assembly and reflow techniques, and does not require underfill on qualified device size and I/O layouts.

Therefore, WLCSP has seen tremendous growth as a true chip scale package, by allowing direct chip attach of a flip chip die without underfill, but is restricted to relatively small die size and low I/O count. WLCSP has seen tremendous growth for mobile and smart phone application, especially for power management ICs.

SUMMARY

In one illustrative embodiment, a method is provided for creating an integrated conductive polymer-solder ball structure. The illustrative embodiment applies a sputter seed layer to a wafer structure. The illustrative embodiment applies one or more conductive polymer pad structures to the sputtered seed layer at locations on the wafer structure where one or more solder ball structures will be formed. The illustrative embodiment applies an electroplating layer to portions of the one or more conductive polymer pad structures where a photoresist layer has been exposed. The illustrative embodiment forms a solder ball on each of the electroplating layers thereby forming the one or more solder ball structures.

In another illustrative embodiment, an integrated conductive polymer-solder ball structure is provided. The integrated conductive polymer-solder ball structure comprises a sputter seed layer applied to a wafer structure, one or more conductive polymer pad structures applied to the sputtered seed layer at locations on the wafer structure where one or more solder ball structures will be formed, an electroplating layer applied to portions of the one or more conductive polymer pad structures where a photoresist layer has been exposed, and a solder ball formed on each of the electroplating layers thereby forming the one or more solder ball structures.

In yet another illustrative embodiment, an integrated circuit comprising one or more integrated conductive polymer-solder ball structures is provided. Each integrated conductive polymer-solder ball structure comprises a sputter seed layer applied to a wafer structure, one or more conductive polymer pad structures applied to the sputtered seed layer at locations on the wafer structure where one or more solder ball structures will be formed, an electroplating layer applied to portions of the one or more conductive polymer pad structures where a photoresist layer has been exposed, and a solder ball formed on each of the electroplating layers thereby forming the one or more solder ball structures.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

As stated previously, wafer-level chip-scale package (CSP) (WLCSP) refers to a technology of packaging an integrated circuit at a wafer level, resulting in a device practically the same size as the die. However, current WLCSP is constrained by two major factors: chip size and bump pitch/density. With regard to chip size, WLCSP requires that all bumps must be contained within the chip footprint, which is not economically feasible to grow chip size. With regard to bump pitch/density, reducing the bump size/pitch increases bump density, but such a smaller bump reduces the reliability. While redistribution layers may be added, the cost of adding the redistribution layers also causes a significant cost increase. Thus, the illustrative embodiments provide a screen printed conductive polymer base for a WLCSP solder bump, which improves reliability as well as enables larger chip sizes to utilize the WLCSP solution without the need to add an additional redistribution layer to the wafer.

The present description and claims may make use of the terms "a," "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these terms/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Figure 1A:
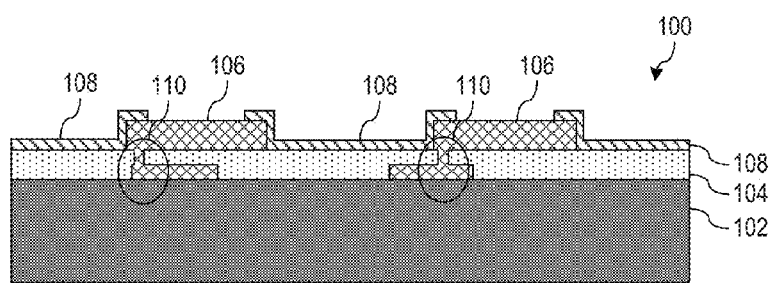
FIGS. 1A-1F depict one example of creating an integrated conductive polymer-solder base in accordance with an illustrative embodiment.

Again, the illustrative embodiments provide for improving the reliability as well as enabling larger chip sizes to utilize a WLCSP solution without the need to add an additional redistribution layer to the wafer by providing a screen printed conductive polymer base for a WLCSP solder bump. FIGS. 1A-1F depict one example of creating an integrated conductive polymer-solder base in accordance with an illustrative embodiment. Initially, as shown in FIG. 1A, a bare wafer structure 100 is constructed to comprise a substrate layer 102, an oxide dielectric layer 104, one or more aluminum pad structures 106 applied to the oxide dielectric layer 104 at locations on the wafer structure 100 where one or more solder ball structures will be formed, and a hard oxide/nitride passivation dielectric layer 108 applied to the other locations on the wafer structure 100 where the one or more solder ball structures will not be formed. The oxide dielectric layer 104 includes chip back end of line (BEOL), thus the oxide dielectric layer 104 may potentially include numerous metal layers and passivation layers as well as a low-k dielectric, which is a material with a small dielectric constant relative to silicon dioxide. As is illustrated, the one or more aluminum pad structures 106 may penetrate the oxide dielectric layer 104 at points 110 in order to provide an electrical conductive path to the substrate layer 102. As is further illustrated, the hard oxide/nitride passivation dielectric layer 108 may also be applied to outer portions of the one or more aluminum pad structures 106 in order to provide structural support for the aluminum pads structures 106.

Figure 1B:
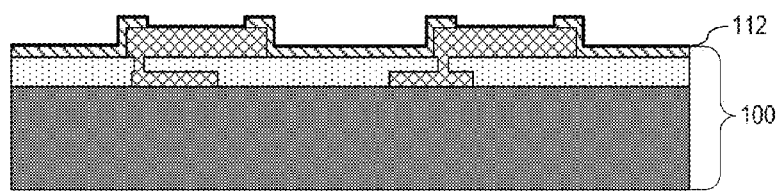
Figure 1C:
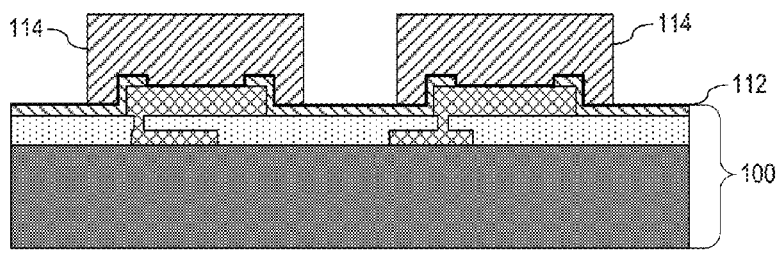
Figure 1D:
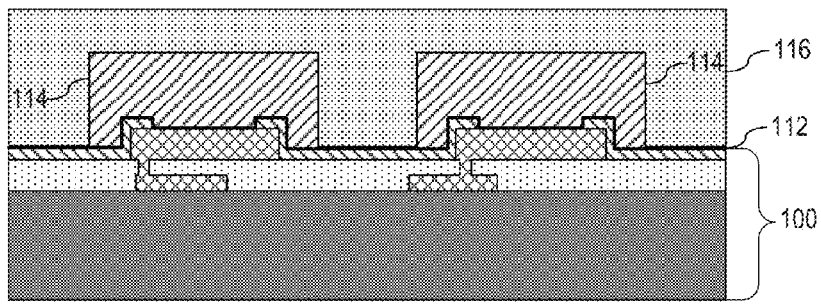
Figure 1E:
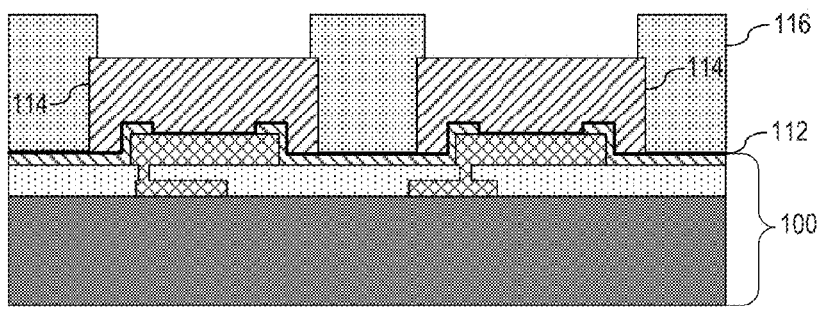
Figure 1F:
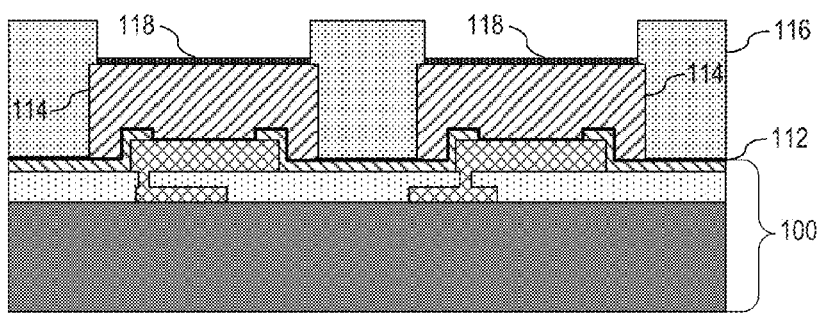

As is illustrated in FIG. 1B, the next step is to apply a sputter seed layer 112 to the wafer structure 100. Sputtered seed layer 112 may be comprised of titanium and copper; titanium, tungsten, and copper; chromium and chromium copper; titanium and nickel vanadium; or other combination of these materials. Then, in FIG. 1C, a stencil is used to mask-off areas where one or more solder ball structures will be formed. With the stencil applied, one or more conductive polymer pad structures 114 are formed via screen printing on top of the sputtered seed layer 112 at locations on the wafer structure where one or more solder ball structures will be formed. Conductive polymer pad structures 114 is typically a B-stage polymer or a thermoplastic polymer, which is filled with electrically conductive particles, such as silver, gold, copper, or nickel, or filled with conductive particles consisting of a polymer core with nickel plating or gold plating. As is illustrated in FIG. 1D, a photoresist layer 116 is applied on top of the exposed portions of the sputtered seed layer 112 and the one or more conductive polymer pad structures 114. In FIG. 1E, a mask is applied which allows portions of the one or more conductive polymer pad structures 114 to be exposed. Once the intended portions of the one or more conductive polymer pad structures 114 are exposed, an electroplating layer 118 is applied to the exposed portions of the one or more conductive polymer pad structures 114, as is illustrated in FIG. 1F. In accordance with one illustrative embodiment, the electroplating layer 118 may be a layer of nickel, copper, titanium, titanium tungsten, chromium, chromium copper, nickel vanadium, or other combination of these materials or another metal used to interface between the one or more conductive polymer pad structures 114 and one or more solder ball structures. In another illustrative embodiment, the electroplating layer 118 may be a layer comprising nickel, copper, titanium, titanium tungsten, chromium, chromium copper, nickel vanadium, or other combination of these materials or another metal used to interface between the one or more conductive polymer pad structures 114 and one or more solder ball structures, and gold. The composition of the electroplating layer 118 is dependent on the method to be used in forming the one or more solder ball structures.

Figure 2A:
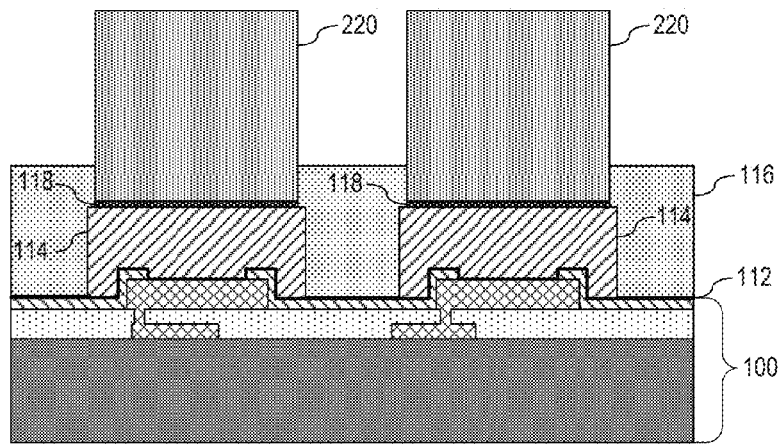
FIGS. 2A and 2B depict an example of forming a solder ball on top of the integrated conductive polymer-solder base illustrated in FIGS. 1A-1D utilizing an electroplated bump option in accordance with an illustrative embodiment.
Figure 2B:
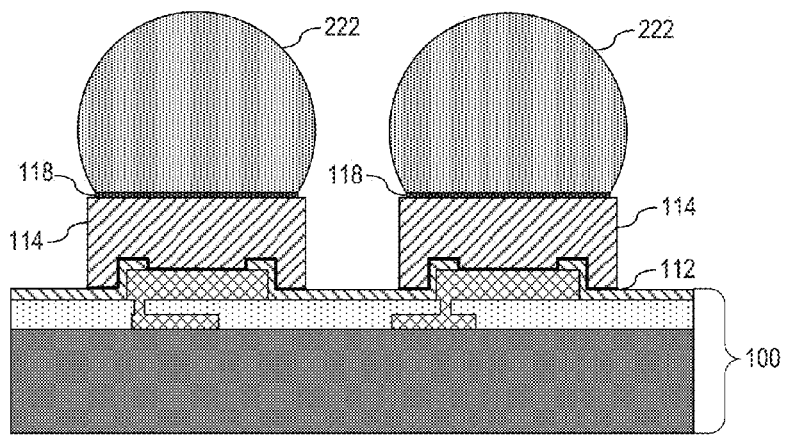

FIGS. 2A and 2B depict an example of forming a solder ball on top of the integrated conductive polymer-solder base illustrated in FIGS. 1A-1D utilizing an electroplated bump option in accordance with an illustrative embodiment. As is illustrated in FIG. 2A, a solder structure 220 is plated-up on each of the associated electroplated layers 118 in the photoresist opening. The solder structure 220 may be comprised of tin, lead, silver, copper, bismuth, gold, nickel, or combinations of these materials. After the solder structures 220 are formed, as is shown in FIG. 2B, any remaining portions of the photoresist layer 116 are removed followed by removing the sputter seed layer 112 through etching. Finally, each of plated-up solder structures 220 are reflowed by heating the solder to a predetermined temperature, such as to 260° F., in order to form the one or more solder ball structures 222. As stated previously, the composition of the electroplating layer 118 is dependent on the method to be used in forming the one or more solder ball structures. Thus, in the electroplated bump option methodology, the electroplating layer 118 is nickel, copper, titanium, titanium tungsten, chromium, chromium copper, nickel vanadium, or other combination of these materials or another metal used to interface between the one or more conductive polymer pad structures 114 and one or more solder ball structures.

Figure 3A:
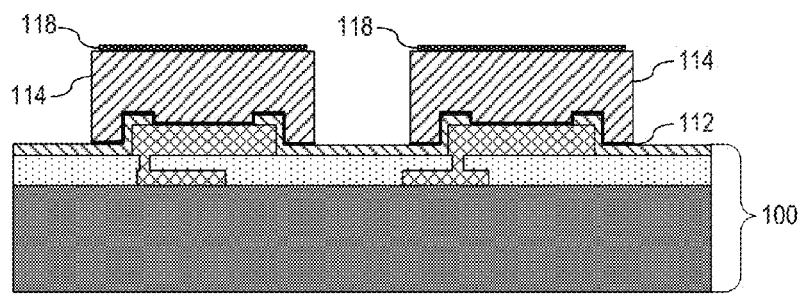
FIGS. 3A and 3B depict another example of forming a solder ball on top of the integrated conductive polymer-solder base illustrated in FIGS. 1A-1D utilizing a ball drop option in accordance with an illustrative embodiment.
Figure 3B:
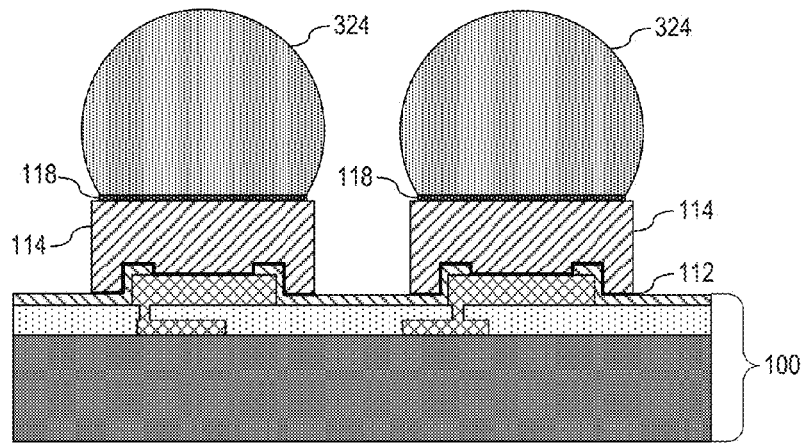

FIGS. 3A and 3B depict another example of forming a solder ball on top of the integrated conductive polymer-solder base illustrated in FIGS. 1A-1D utilizing a ball drop option in accordance with an illustrative embodiment. Prior to this process, any remaining portions of the photoresist layer 116 are removed followed by removing the sputter seed layer 112 through etching. As is illustrated in FIG. 3A a temporary stencil is used to apply flux to electroplating layer 118. That is, a first stencil is applied to the wafer and flux is screen printed through the first stencil to apply the flux to the electroplating layer 118. Once flux has been applied, the first stencil is removed and then a second stencil is applied to facilitate solder ball placement on the electroplating layer 118, which now has flux on its surface. As is shown in FIG. 3B, a ball of solder 324 is then placed into the stencil openings on each associated electroplating layer 118 by dropping the solder through the second stencil onto the associated electroplating layer 118. The second stencil is removed and the ball of solder 324 is reflowed by heating the ball of solder 324 to a predetermined temperature, such as to 260° F., in order to form the one or more solder ball structures 324 and join ball of solder 324 to the electroplating layer 118. Each of the one or more solder ball structures 324 may be comprised of tin, lead, silver, copper, bismuth, gold, nickel, or combinations of these materials. As stated previously, the composition of the electroplating layer 118 is dependent on the method to be used in forming the one or more solder ball structures. Thus, in the ball drop option methodology, the electroplating layer 118 is nickel, copper, titanium, titanium tungsten, chromium, chromium copper, nickel vanadium, or other combination of these materials or another metal used to interface between the one or more conductive polymer pad structures 114 and one or more solder ball structures, and gold (Au).

Figure 4A:
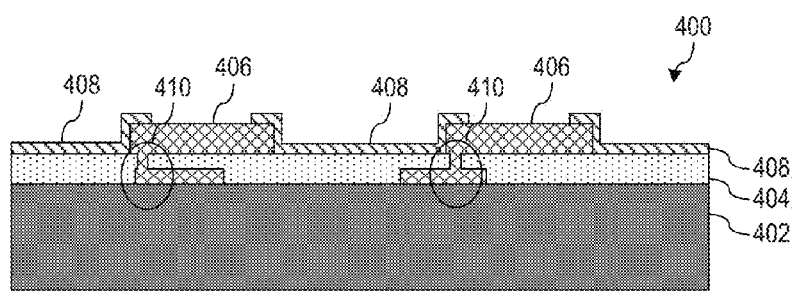
FIGS. 4A-4G depict another example of creating an integrated conductive polymer-solder base in accordance with an illustrative embodiment.

FIGS. 4A-4G depict another example of creating an integrated conductive polymer-solder base in accordance with an illustrative embodiment. Initially, as shown in FIG. 4A, a bare wafer structure 400 is constructed to comprise a substrate layer 402, an oxide dielectric layer 404, one or more aluminum pad structures 406 applied to the oxide dielectric layer 404 at locations on the wafer structure 400 where one or more solder ball structures will be formed, and a hard oxide/nitride passivation dielectric layer 408 applied to the other locations on the wafer structure 400 where the one or more solder ball structures will not be formed. The oxide dielectric layer 404 includes chip back end of line (BEOL), thus the oxide dielectric layer 404 may potentially include numerous metal layers and passivation layers as well as a low-k dielectric, which is a material with a small dielectric constant relative to silicon dioxide. As is illustrated, the one or more aluminum pad structures 406 may penetrate the oxide dielectric layer 404 at points 410 in order to provide an electrical conductive path to the substrate layer 402. As is further illustrated, the hard oxide/nitride passivation dielectric layer 408 may also be applied to outer portions of the one or more aluminum pad structures 406 in order to provide structural support for the aluminum pad structures 406.

Figure 4B:
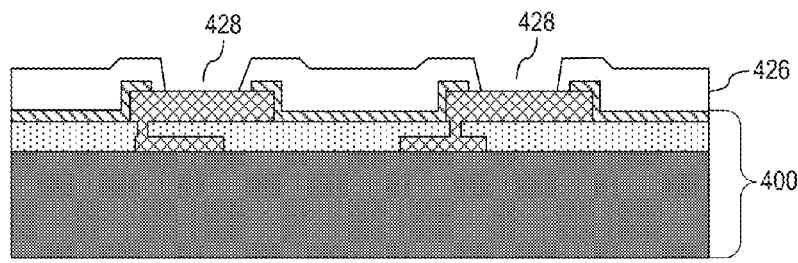
Figure 4C:
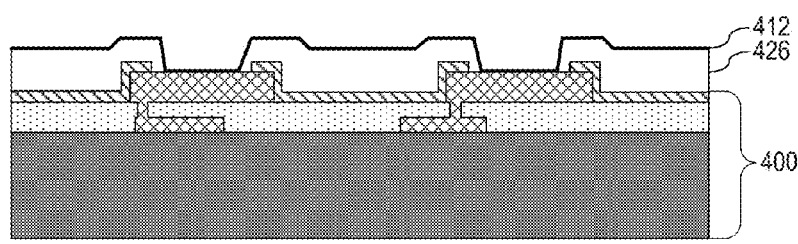
Figure 4D:
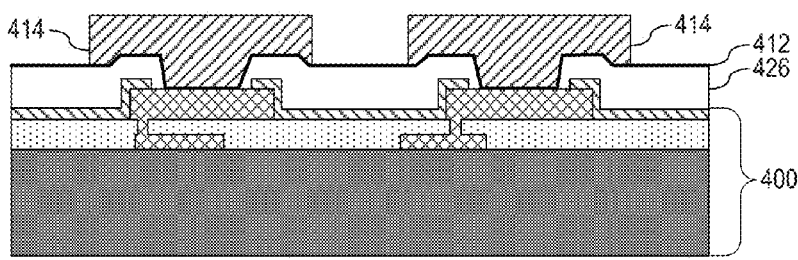
Figure 4E:
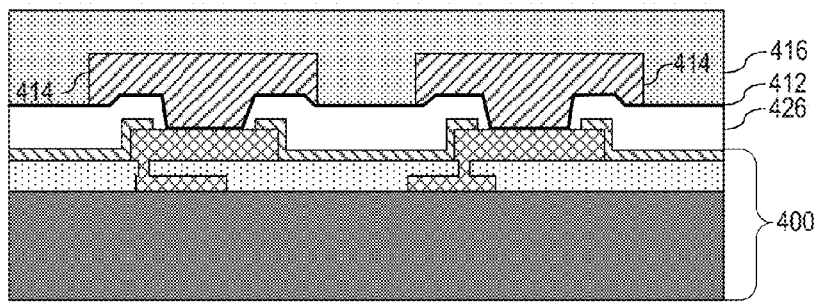
Figure 4F:
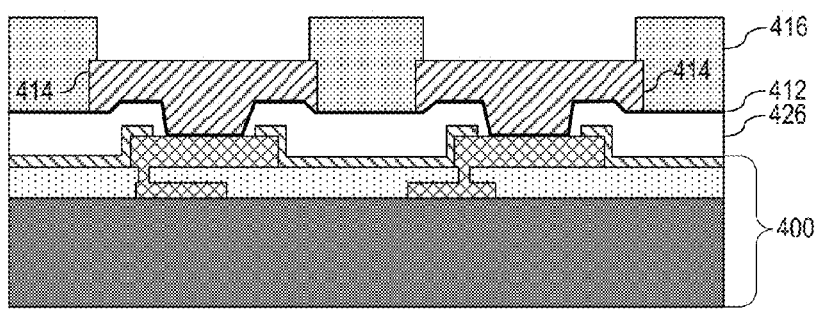
Figure 4G:
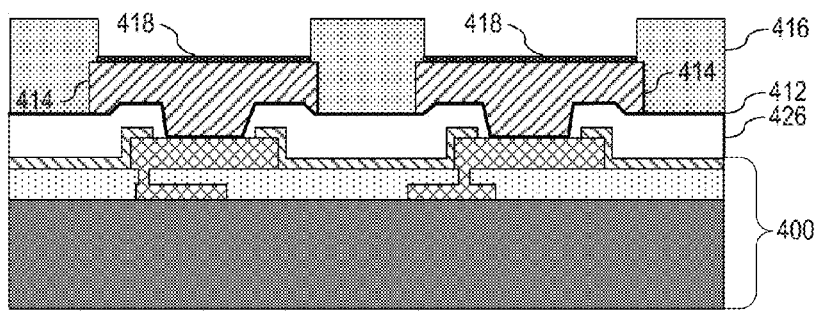

In FIG. 4B, a polyimide coating 426 is applied to the wafer structure 400 and openings 428 are formed in the polyimide coating 426 where one or more solder ball structures will be formed. As is illustrated in FIG. 4C, a sputter seed layer 412 is applied to the polyimide coating 426 and open portions of the wafer structure 400. Sputtered seed layer 412 may be comprised of titanium and copper; titanium, tungsten, and copper; chromium and chromium copper; titanium and nickel vanadium; or other combination of these materials. Then, in FIG. 4D, a stencil is used to mask-off areas where one or more solder ball structures will be formed. With the stencil applied, one or more conductive polymer pad structures 414 are formed via screen printing on top of the sputtered seed layer 412 at locations on the wafer structure where one or more solder ball structures will be formed. Conductive polymer pad structures 414 is typically a B-stage polymer or a thermoplastic polymer, which is filled with electrically conductive particles, such as silver, gold, copper, or nickel, or filled with conductive particles consisting of a polymer core with nickel plating or gold plating. As is illustrated in FIG. 4E, a photoresist layer 416 is applied on top of the exposed portions of the sputtered seed layer 412 and the one or more conductive polymer pad structures 414. In FIG. 4F, a mask is applied which allows portions of the one or more conductive polymer pad structures 414 to be exposed. Once the intended portions of the one or more conductive polymer pad structures 414 are exposed, an electroplating layer 418 is applied to the exposed portions of the one or more conductive polymer pad structures 414, as is illustrated in FIG. 4G. In accordance with one illustrative embodiment, the electroplating layer 418 may be a layer of nickel, copper, titanium, titanium tungsten, chromium, chromium copper, nickel vanadium, or other combination of these materials or another metal used to interface between the one or more conductive polymer pad structures 114 and one or more solder ball structures. In another illustrative embodiment, the electroplating layer 418 may be a layer comprising nickel, copper, titanium, titanium tungsten, chromium, chromium copper, nickel vanadium, or other combination of these materials or another metal used to interface between the one or more conductive polymer pad structures 114 and one or more solder ball structures, and gold. The composition of the electroplating layer 418 is dependent on the method to be used in forming the one or more solder ball structures.

Figure 5A:
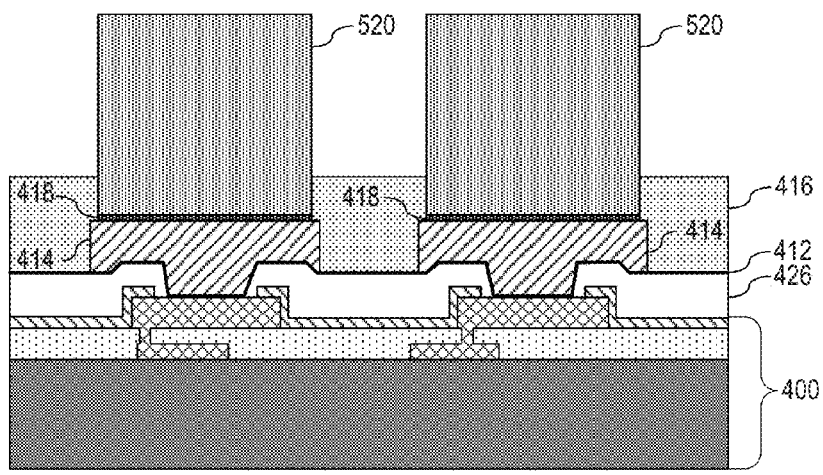
FIGS. 5A and 5B depict an example of forming a solder ball on top of the integrated conductive polymer-solder base illustrated in FIGS. 4A-4E utilizing an electroplated bump option in accordance with an illustrative embodiment.
Figure 5B:
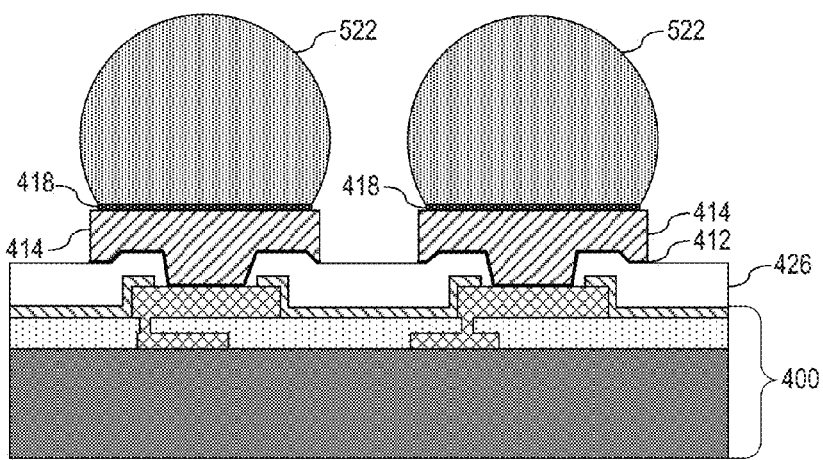

FIGS. 5A and 5B depict an example of forming a solder ball on top of the integrated conductive polymer-solder base illustrated in FIGS. 4A-4E utilizing an electroplated bump option in accordance with an illustrative embodiment. Prior to this process, any remaining portions of the photoresist layer 416 are removed followed by removing the sputter seed layer 412 through etching. As is illustrated in FIG. 5A, a solder structure 520 is plated-up on each of the associated electroplating layers 418 in the photoresist opening. The solder structure 520 may be comprised of tin, lead, silver, copper, bismuth, gold, nickel, or combinations of these materials. After the solder structures 520 are formed, as is shown in FIG. 5B, any remaining portions of the photoresist layer 416 are removed followed by removing the sputter seed layer 412 through etching. Finally, each of plated-up solder structures 520 are reflowed by heating the solder to a predetermined temperature, such as to 260° F., in order to form the one or more solder ball structures 522, which also joins the solder ball structures 522 to the associated electroplating layer 418. As stated previously, the composition of the electroplating layer 418 is dependent on the method to be used in forming the one or more solder ball structures. Thus, in the electroplated bump option methodology, the electroplating layer 418 is nickel, copper, titanium, titanium tungsten, chromium, chromium copper, nickel vanadium, or other combination of these materials or another metal used to interface between the one or more conductive polymer pad structures 114 and one or more solder ball structures.

Figure 6A:
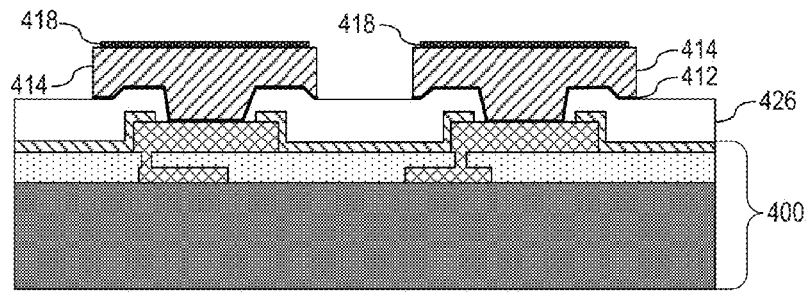
FIGS. 6A and 6B depict another example of forming a solder ball on top of the integrated conductive polymer-solder base illustrated in FIGS. 4A-4E utilizing a ball drop option in accordance with an illustrative embodiment.
Figure 6B:
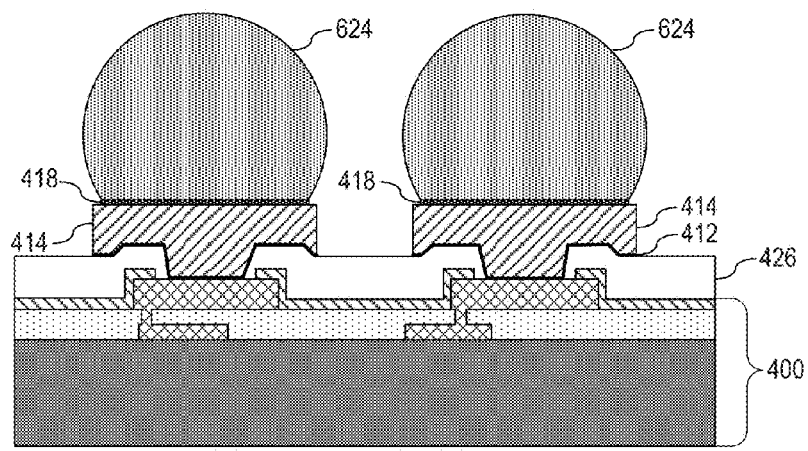

FIGS. 6A and 6B depict another example of forming a solder ball on top of the integrated conductive polymer-solder base illustrated in FIGS. 4A-4E utilizing a ball drop option in accordance with an illustrative embodiment. As is illustrated in FIG. 6A a temporary stencil is used to apply flux to electroplating layer 418. That is, a first stencil is applied to the wafer and flux is screen printed through the first stencil to apply the flux to the electroplating layer 418. Once flux has been applied, the first stencil is removed and then a second stencil is applied to facilitate solder ball placement on the electroplating layer 418, which now has flux on its surface. As is shown in FIG. 6B, a ball of solder 624 is then placed into the stencil openings on each associated electroplating layer 418 by dropping the solder through the second stencil onto the associated electroplating layer 418. The second stencil is removed and the ball of solder 624 is reflowed by heating the ball of solder 624 to a predetermined temperature, such as to 260° F., in order to form the one or more solder ball structures 624 and join ball of solder 624 to the electroplating layer 418. Each of the one or more solder ball structures 624 may be comprised of tin, lead, silver, copper, bismuth, gold, nickel, or combinations of these materials. As stated previously, the composition of the electroplating layer 418 is dependent on the method to be used in forming the one or more solder ball structures. Thus, in the ball drop option methodology, the electroplating layer 418 is nickel, copper, titanium, titanium tungsten, chromium, chromium copper, nickel vanadium, or other combination of these materials or another metal used to interface between the one or more conductive polymer pad structures 114 and one or more solder ball structures, and gold (Au).

Thus, the illustrative embodiments provide for a screen printed conductive polymer base for a WLCSP solder bump, which improves reliability as well as enables larger chip sizes to utilize the WLCSP solution without the need to add an additional redistribution layer to the wafer. A wafer structure is coated with a sputter seed layer and then one or more conductive polymer pad structures are applied to the sputtered seed layer at locations on the wafer structure where one or more solder ball structures will be formed. Portions of the one or more conductive polymer pad structures are masked off and a photoresist layer is applied to the wafer. Then, the portions of the one or more conductive polymer pad structures that were masked off are opened up to expose the top of one or more conductive polymer pad structures and an electroplating layer is applied to the exposed portions of the one or more conductive polymer pad structures. An electroplating layer is applied to each of the photoresist layers. Finally, a solder ball is formed on each of the electroplating layers thereby forming the one or more solder ball structures. Creating a screen printed conductive polymer base for a WLCSP solder bump in this way lowers the cost as compared to a double redistribution layer method while improving reliability. The illustrated process also allows for growth of chip size or reduction of WLCSO bump size/pitch. For WLCSP to be joined to next level of assembly, the wafer must be thinned and each chip must be diced out.

Figure 7:
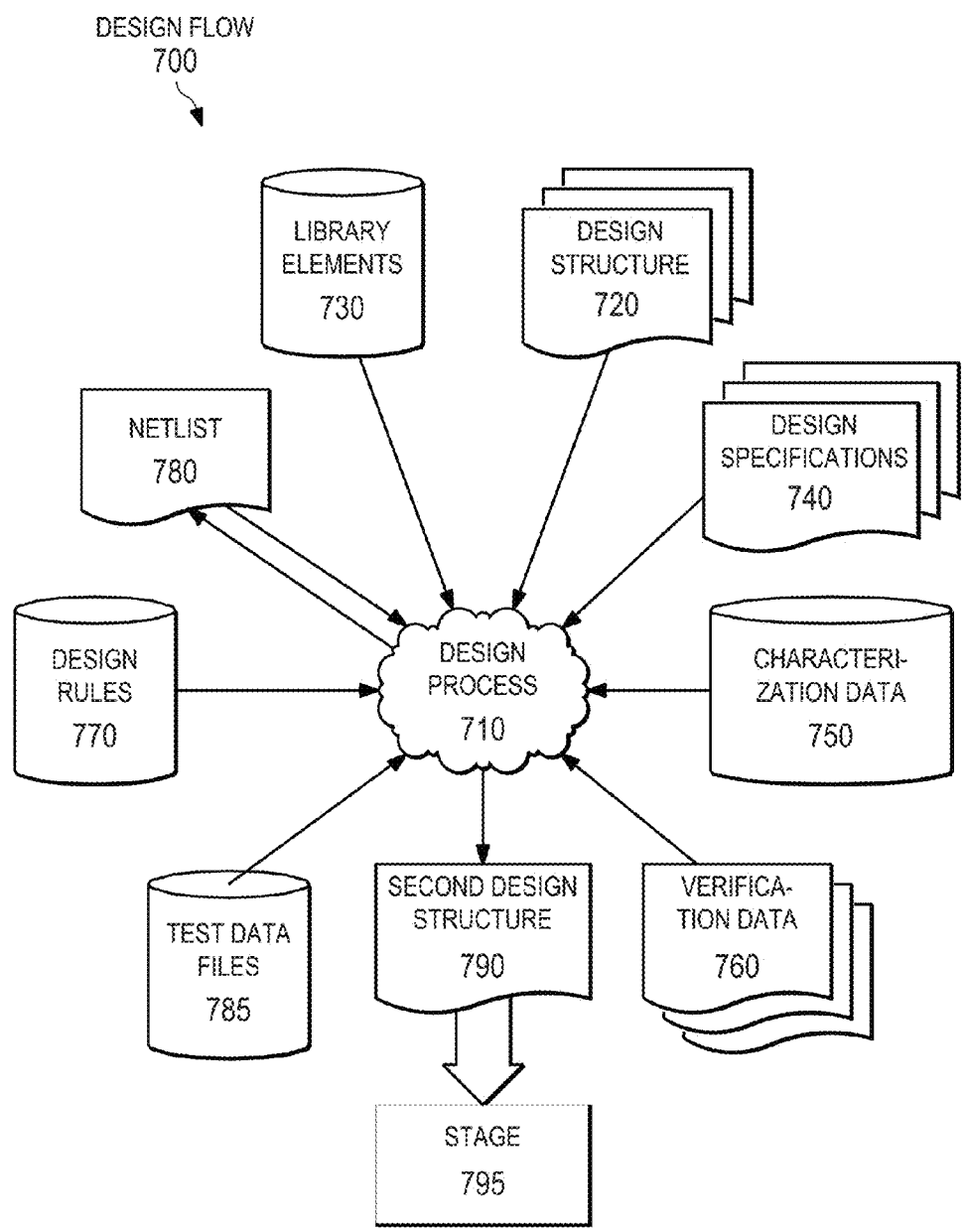
FIG. 7 shows a block diagram of an exemplary design flow used for example, in semiconductor IC logic design, simulation, test, layout, and manufacture in accordance with an illustrative embodiment.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1-6. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1-6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention.

Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 790 may comprise a compiled, executable HDL simulation model that functionally simulates the devices shown in FIGS. 1-6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 790 may then proceed to a stage 795 where, for example, design structure 790: proceeds to tape-out, is released to manufacturing, is released to a mask house, is sent to another design house, is sent back to the customer, etc.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a wafer structure;
    a sputter seed layer applied to the wafer structure;
    one or more conductive polymer pad structures applied to the sputtered seed layer at locations on the wafer structure where one or more solder ball structures will be formed;
    an electroplating layer applied to portions of the one or more conductive polymer pad structures where a photoresist layer has been exposed; and
    a solder ball formed on each of the electroplating layers thereby forming the one or more solder ball structures, wherein each of the electroplating layers is comprised of gold and at least one of nickel, copper, titanium, titanium tungsten, chromium, chromium copper, or nickel vanadium.

2. A structure comprising:
    a wafer structure including an oxide dielectric layer applied to a substrate layer, one or more aluminum pad structures applied to the oxide dielectric layer at locations on the wafer structure where one or more solder ball structures will be formed, and a hard oxide/nitride passivation dielectric layer applied to other locations on the wafer structure where the one or more solder ball structures will not be formed;
    a sputter seed layer applied to the wafer structure;
    one or more conductive polymer pad structures applied to the sputtered seed layer at the locations on the wafer structure where the one or more solder ball structures will be formed;
    an electroplating layer applied to portions of the one or more conductive polymer pad structures where a photoresist layer has been exposed; and
    a solder ball formed on each of the electroplating layers thereby forming the one or more solder ball structures.

3. The structure of claim 2, wherein the one or more aluminum pad structures penetrate the oxide dielectric layer in order to provide an electrical conductive path to the substrate layer.

4. The structure of claim 2, wherein the hard oxide/nitride passivation dielectric layer is also applied to outer portions of the one or more aluminum pad structures in order to provide structural support for the aluminum pad structures.

5. The structure of claim 4, wherein the wafer structure further comprises:
    a polyimide coating applied to the hard oxide/nitride passivation dielectric layer location on the wafer structure where the one or more solder ball structures will not be formed.

6. An integrated circuit that utilizes one or more polymer-solder ball structures, each integrated conductive polymer-solder ball structure comprising:
    a wafer structure including an oxide dielectric layer applied to a substrate layer, one or more aluminum pad structures applied to the oxide dielectric layer at locations on the wafer structure where the one or more solder ball structures will be formed, and a hard oxide/nitride passivation dielectric layer applied to other locations on the wafer structure where the one or more solder ball structures will not be formed;
    a sputter seed layer applied to the wafer structure;
    one or more conductive polymer pad structures applied to the sputtered seed layer at the locations on the wafer structure where the one or more solder ball structures will be formed;
    an electroplating layer applied to portions of the one or more conductive polymer pad structures where a photoresist layer has been exposed; and
    a solder ball formed on each of the electroplating layers thereby forming the one or more solder ball structures.

7. The integrated circuit of claim 6, wherein the one or more aluminum pad structures penetrate the oxide dielectric layer in order to provide an electrical conductive path to the substrate layer.

8. The integrated circuit of claim 6, wherein the hard oxide/nitride passivation dielectric layer is also applied to outer portions of the one or more aluminum pad structures in order to provide structural support for the aluminum pad structures.

9. The integrated circuit of claim 8, wherein the wafer structure further comprises:
 a polyimide coating applied to the hard oxide/nitride passivation dielectric layer location on the wafer structure where the one or more solder ball structures will not be formed.

* * * * *